(12) United States Patent
Kim et al.

(10) Patent No.: US 10,707,196 B2
(45) Date of Patent: Jul. 7, 2020

(54) ELECTRONIC DEVICE AND METHOD OF MANUFACTURING THE ELECTRONIC DEVICE

(71) Applicant: Samsung Electronics Co., Ltd., Suwon-si (KR)

(72) Inventors: Jae-Choon Kim, Incheon (KR); Young-Deuk Kim, Hwaseong-si (KR); Woo-Hyun Park, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/162,598

(22) Filed: Oct. 17, 2018

(65) Prior Publication Data
US 2019/0198489 A1 Jun. 27, 2019

(30) Foreign Application Priority Data
Dec. 22, 2017 (KR) .......................... 10-2017-0178636

(51) Int. Cl.
*H01L 23/02* (2006.01)
*H01L 25/18* (2006.01)
(Continued)

(52) U.S. Cl.
CPC ............ *H01L 25/18* (2013.01); *H01L 23/427* (2013.01); *H01L 23/481* (2013.01); *H05K 1/181* (2013.01);
(Continued)

(58) Field of Classification Search
None
See application file for complete search history.

(56) References Cited

U.S. PATENT DOCUMENTS 5,886,408 A * 3/1999 Ohki ...................... H01L 23/16
257/705
6,229,216 B1 * 5/2001 Ma ..................... H01L 23/49827
257/698
(Continued)

FOREIGN PATENT DOCUMENTS

JP         2003124415 A       4/2003
JP         4820256 B2          9/2011

*Primary Examiner* — Ali Naraghi
(74) *Attorney, Agent, or Firm* — Muir Patent Law, PLLC

(57) ABSTRACT

An electronic device includes a substrate, a first electronic product arranged on the substrate, a second electronic product arranged on the substrate to be spaced apart from the first electronic product, and a heat dissipating assembly covering the first and second electronic products, the heat dissipating assembly comprising a heat dissipating chamber including a hermetically sealed space having a first portion having one or more gaps in which a flowable heat dissipation fluid is disposed and having a second portion in which a solid thermal conductive member is disposed to prevent the flow of the heat dissipation fluid across the second portion with respect to a plan view, wherein the first portion of the heat dissipating chamber has a first thermal conductivity and overlaps with the first electronic product in the plan view, wherein the solid thermal conductive member has a second thermal conductivity less than the first thermal conductivity, wherein the solid thermal conductive member overlaps with the second electronic product in the plan view, wherein the overlapping area of the solid thermal conductive member with the second electronic product is greater than 50% of an area of the second electronic product in the plan view.

19 Claims, 12 Drawing Sheets

(51) Int. Cl.
  *H05K 1/18* (2006.01)
  *H01L 23/427* (2006.01)
  *H01L 23/48* (2006.01)
  *H01L 25/065* (2006.01)
  *H01L 23/538* (2006.01)
  *H01L 23/367* (2006.01)

(52) U.S. Cl.
  CPC ........ *H01L 23/367* (2013.01); *H01L 23/5384* (2013.01); *H01L 25/0657* (2013.01); *H01L 2225/06513* (2013.01); *H01L 2225/06541* (2013.01); *H01L 2225/06565* (2013.01); *H01L 2225/06586* (2013.01); *H01L 2225/06589* (2013.01); *H05K 2201/10159* (2013.01); *H05K 2201/10378* (2013.01); *H05K 2201/10734* (2013.01)

(56) References Cited

U.S. PATENT DOCUMENTS

| | | |
|---|---|---|
| 7,186,590 B2 | 3/2007 | Klcoe et al. |
| 7,808,781 B2 | 10/2010 | Colgan et al. |
| 7,875,971 B2 | 1/2011 | Sato |
| 9,082,645 B2 | 7/2015 | Takizawa |
| 9,142,476 B2 | 9/2015 | Shioga et al. |
| 9,349,707 B1 * | 5/2016 | Sun .................. H01L 21/486 |
| 2002/0036338 A1 * | 3/2002 | Matsuo ............ H01L 25/0657 |
| | | 257/686 |
| 2005/0274487 A1 | 12/2005 | Goth |
| 2017/0162542 A1 | 6/2017 | Chen et al. |

\* cited by examiner

ELECTRONIC DEVICE AND METHOD OF MANUFACTURING THE ELECTRONIC DEVICE

PRIORITY STATEMENT

This application claims priority under 35 U.S.C. § 119 to Korean Patent Application No. 10-2017-0178636, filed on Dec. 22, 2017 in the Korean Intellectual Property Office (KIPO), the contents of which are herein incorporated by reference in their entirety.

BACKGROUND

1. Field

Example embodiments relate to an electronic device and a method of manufacturing the electronic device. For example, example embodiments relate to an electronic device including heat source products consuming different powers and a method of manufacturing the electronic device.

2. Description of the Related Art

Recently, an electronic device including a high bandwidth memory (HBM) device or a stack chip package may provide high performances such as high capacity and high speed operation. The electronic device may include electronic products consuming different powers. In this case, sufficient heat dissipation may be difficult and there may be unbalance in heat transfer, thereby deteriorating heat transfer efficiency.

SUMMARY

Example embodiments provide an electronic device including a heat dissipating assembly capable of improving heat transfer efficiency.

Example embodiments provide a method of manufacturing the electronic device.

According to example embodiments, an electronic device includes a substrate, a first electronic product arranged on the substrate, a second electronic product arranged on the substrate to be spaced apart from the first electronic product, and a heat dissipating assembly covering the first and second electronic products, the heat dissipating assembly comprising a heat dissipating chamber including a hermetically sealed space having a first portion having one or more gaps in which a flowable heat dissipation fluid is disposed and having a second portion in which a solid thermal conductive member is disposed to prevent the flow of the heat dissipation fluid across the second portion with respect to a plan view, wherein the first portion of the heat dissipating chamber has a first thermal conductivity and overlaps with the first electronic product in the plan view, wherein the solid thermal conductive member has a second thermal conductivity less than the first thermal conductivity, wherein the solid thermal conductive member overlaps with the second electronic product in the plan view, wherein the overlapping area of the solid thermal conductive member with the second electronic product is greater than 50% of an area of the second electronic product in the plan view.

According to example embodiments, an electronic device includes a substrate, a first electronic product arranged on the substrate and consuming a first maximum power, a second electronic product arranged on the substrate to be spaced apart from the first electronic product and consuming a second maximum power less than the first maximum power, and a heat dissipating assembly disposed on the first and second electronic products, the heat dissipating assembly comprising a heat dissipating chamber extending laterally from a first region overlapping with the first electronic product in a plan view and a thermal conductive member provided in the heat dissipating chamber to be in thermal contact with the second electronic product, wherein the thermal conductive member is solid and overlaps with the second electronic product in the plan view, wherein the overlapping area of the thermal conductive member with the second electronic product is greater than 50% of an area of the second electronic product in the plan view.

According to example embodiments, an electronic device includes a substrate, a first electronic product arranged on the substrate and consuming a first maximum power, a second electronic product arranged on the substrate to be spaced apart from the first electronic product and consuming a second maximum power less than the first maximum power, and a heat dissipating assembly on the first and second electronic products to be in thermal communication with the first and second electronic products, the heat dissipating assembly comprising a lower wall/plate and an upper wall/plate hermetically connected to each other to define a heat dissipating chamber for receiving a heat transfer fluid therein, and a thermal conductive member provided in the heat dissipating chamber and in thermal contact with the second electronic product, wherein the thermal conductive member comprises a solid metal and overlaps with the second electronic product in a plan view, wherein the overlapping area of the thermal conductive member with the second electronic product is greater than 50% of an area of the second electronic product in the plan view.

According to example embodiments, an electronic device may include a heat dissipating assembly including a heat dissipating chamber disposed on a first electronic product consuming a relatively high power and a second electronic product consuming a relatively low power. The heat dissipating chamber may dissipate heat generated from the first electronic product quickly and a thermal conductive member of the heat dissipating assembly may be arranged within the heat dissipating chamber to be overlapped with the second electronic product to dissipate heat coming from the second electronic product in a vertical direction and to prevent the heat from the first electronic product from being transferred to the second electronic product.

Accordingly, the electronic device including the electronic products consuming different powers such as 2.5D package may be efficiently thermally dissipated, to thereby improve heat transfer efficiency of the electronic device.

BRIEF DESCRIPTION OF THE DRAWINGS

Example embodiments will be more clearly understood from the following detailed description taken in conjunction with the accompanying drawings.

FIG. 1 is a cross-sectional view illustrating an electronic device in accordance with example embodiments.

FIG. 2 is an exploded perspective view illustrating the electronic device in FIG. 1.

FIG. 3 is a cross-sectional view illustrating a heat dissipating assembly of the electronic device in FIG. 1.

FIG. 4 is a plan view illustrating the heat dissipating assembly in FIG. 3.

FIGS. 5 and 6 are exploded perspective views illustrating a portion of the heat dissipating assembly in accordance with example embodiments.

FIG. 7 is a cross-sectional view illustrating heat transfer in the heat dissipating assembly in FIG. 3.

FIGS. 8 to 11 are views illustrating a method of manufacturing an electronic device in accordance with example embodiments.

FIG. 12 is a cross-sectional view illustrating an electronic device in accordance with example embodiments.

FIG. 13 is a cross-sectional view illustrating an electronic device in accordance with example embodiments.

DETAILED DESCRIPTION

Hereinafter, example embodiments will be explained in detail with reference to the accompanying drawings.

Figure 1:
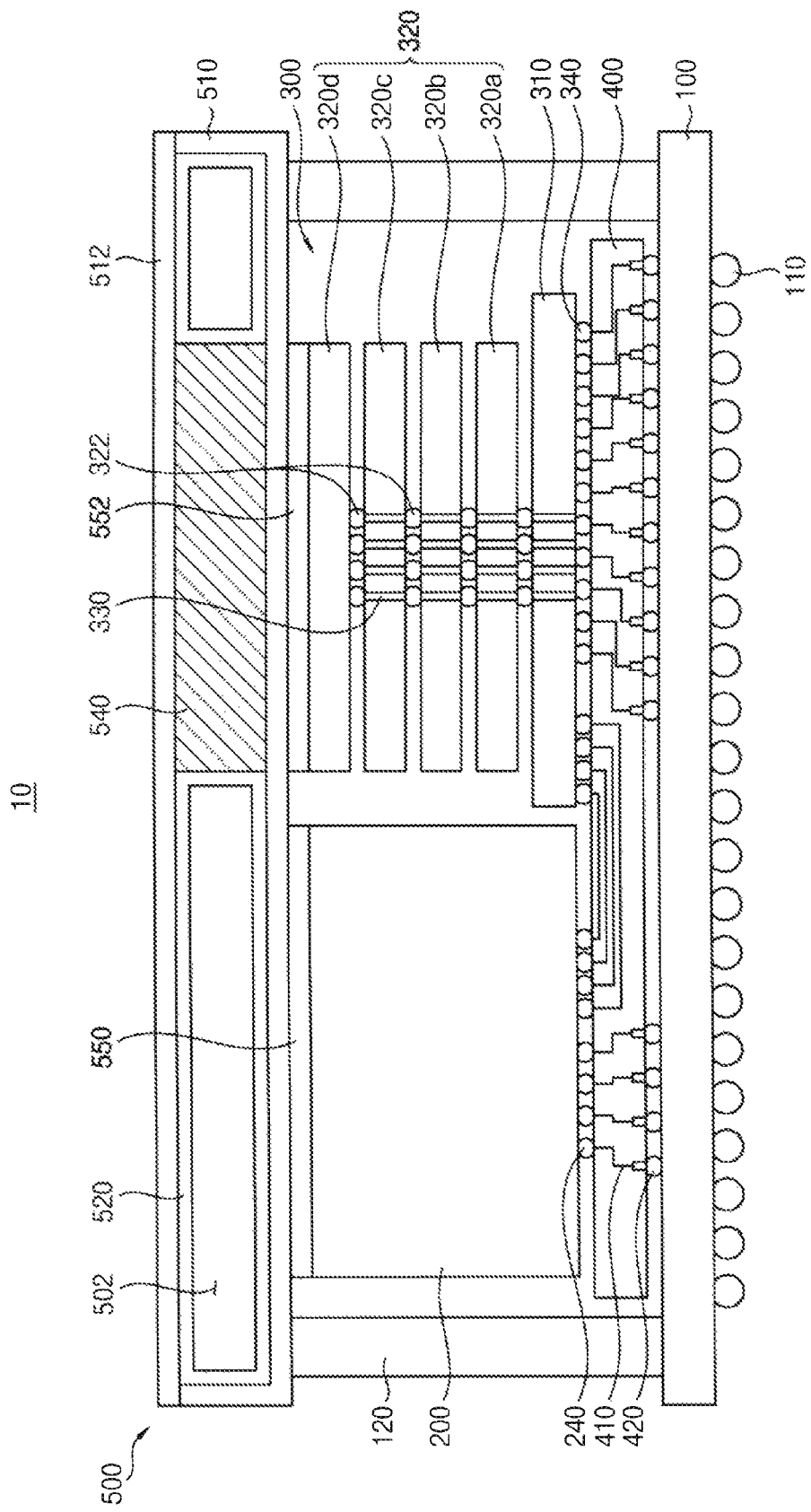
FIGS. 1 to 13 represent non-limiting, example embodiments as described herein.
Figure 2:
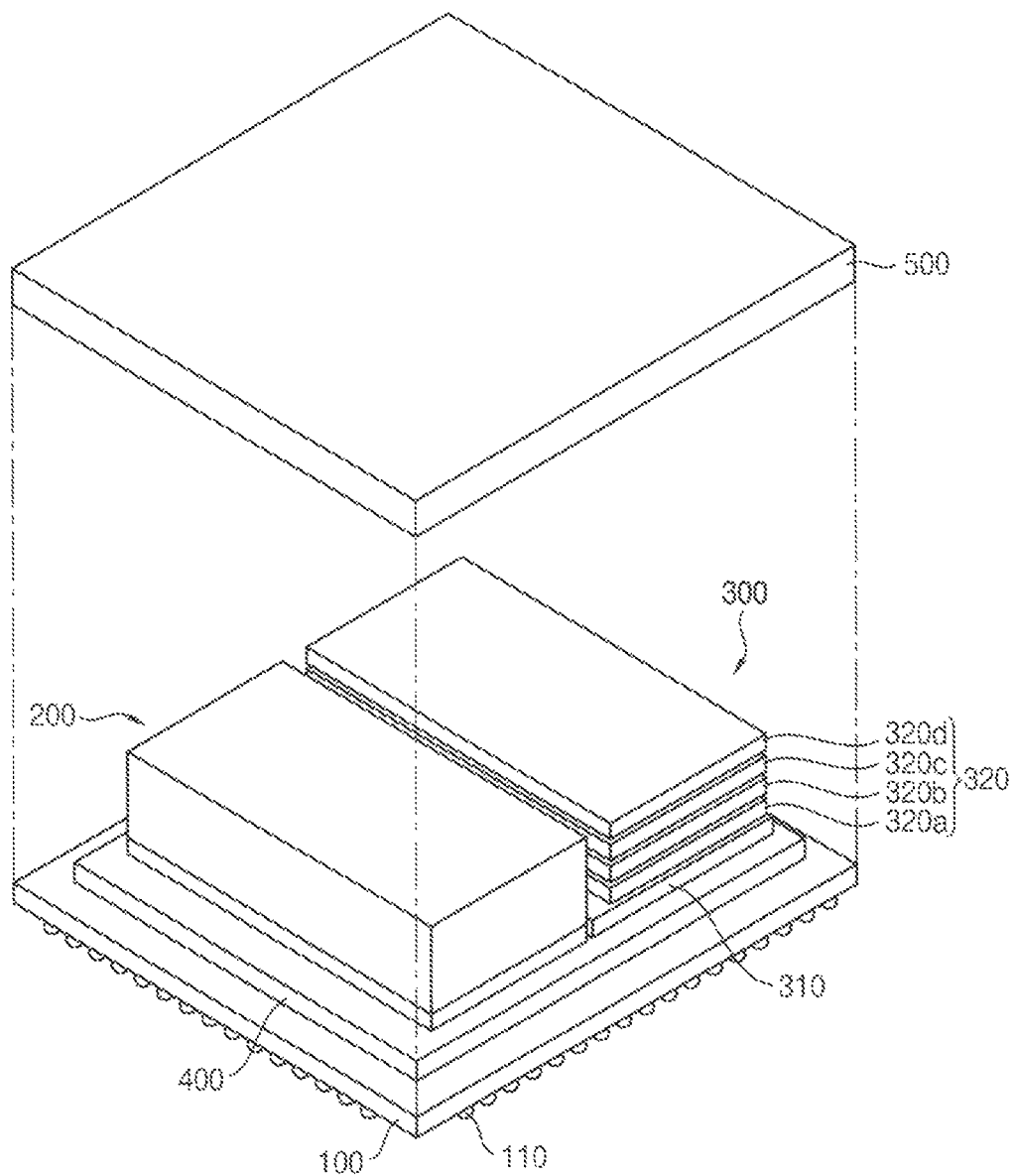
Figure 3:
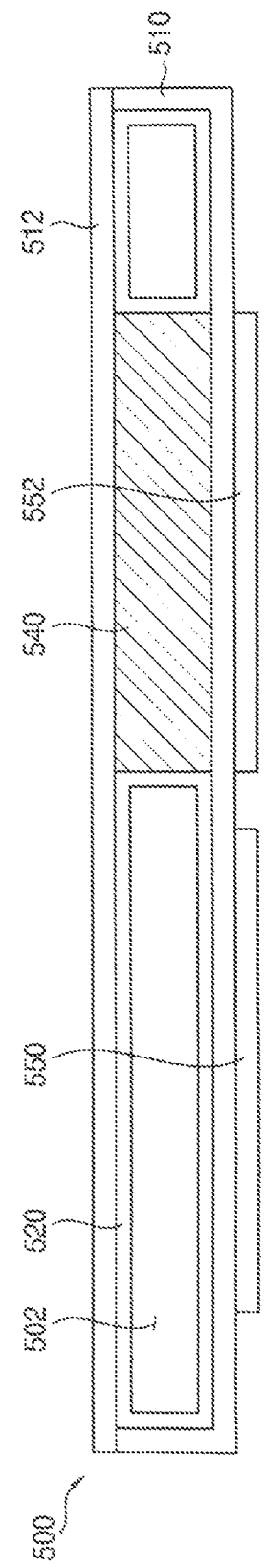
Figure 4:
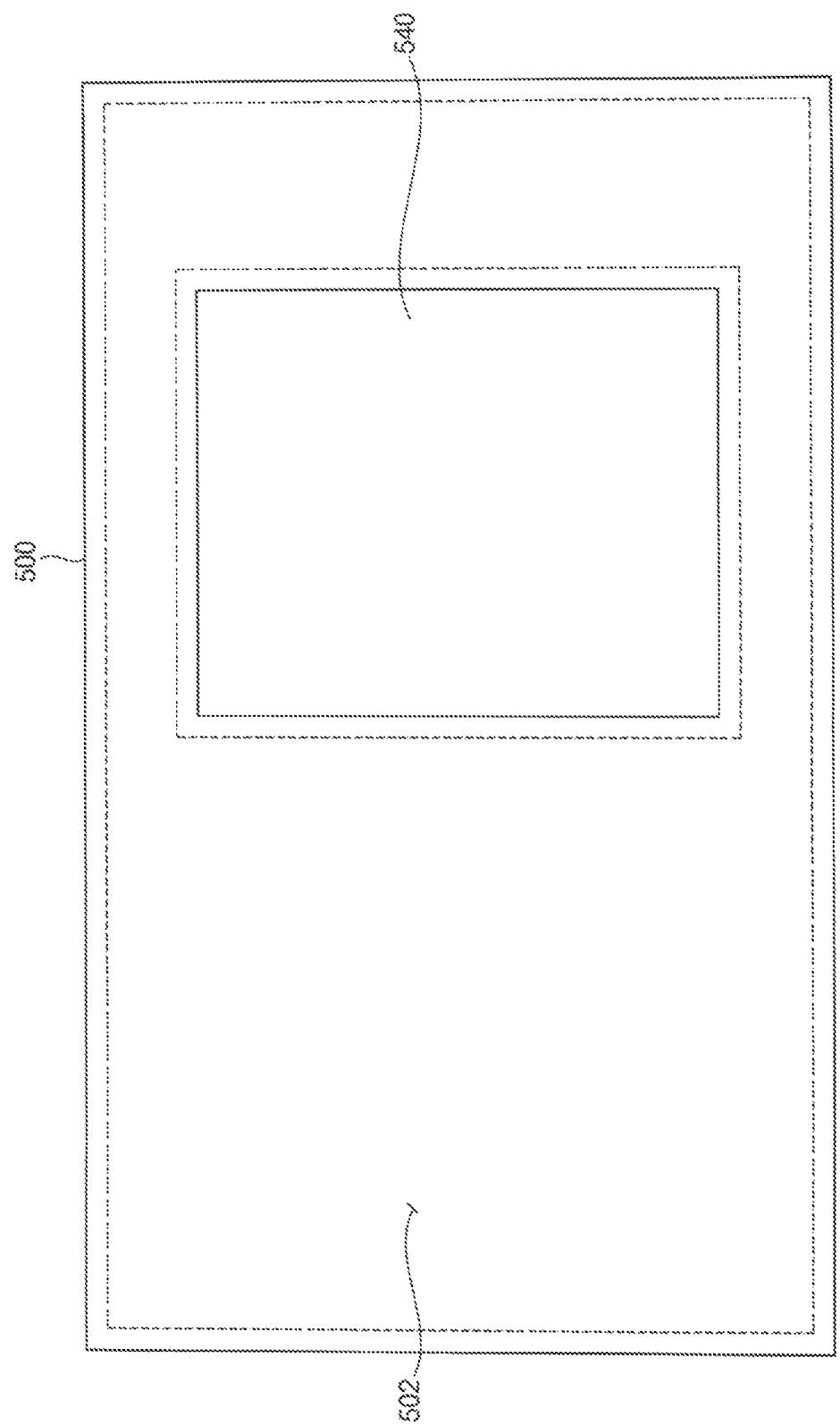
Figure 5:
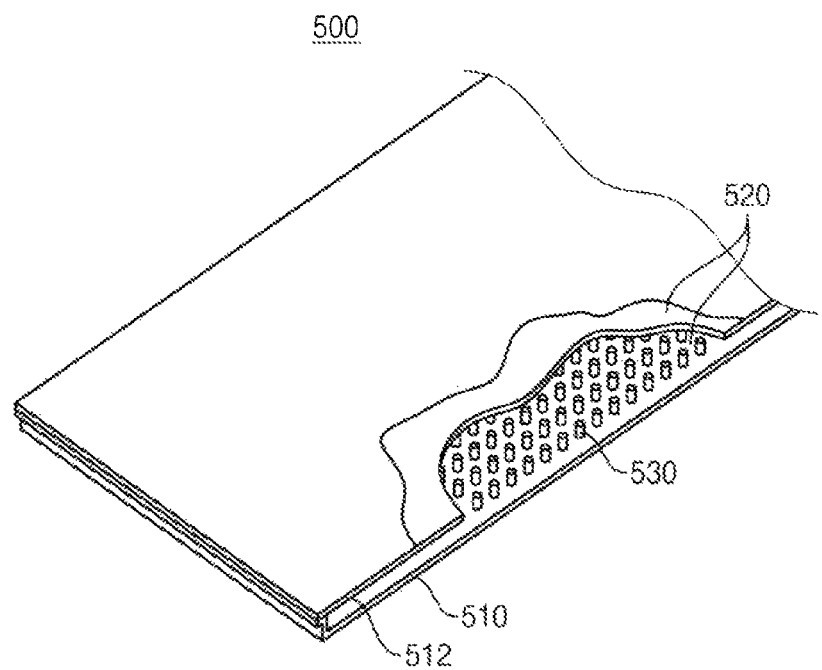
Figure 6:
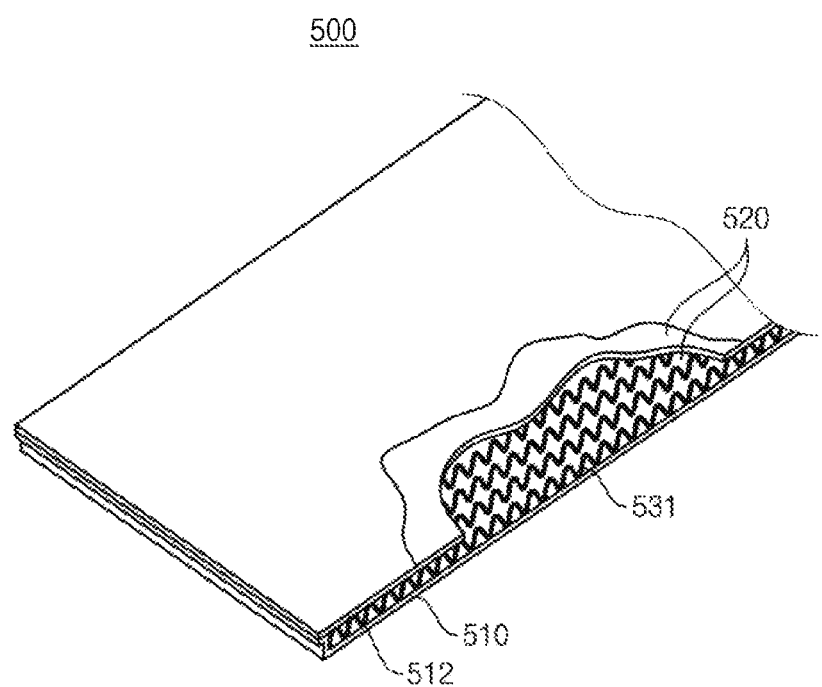
Figure 7:
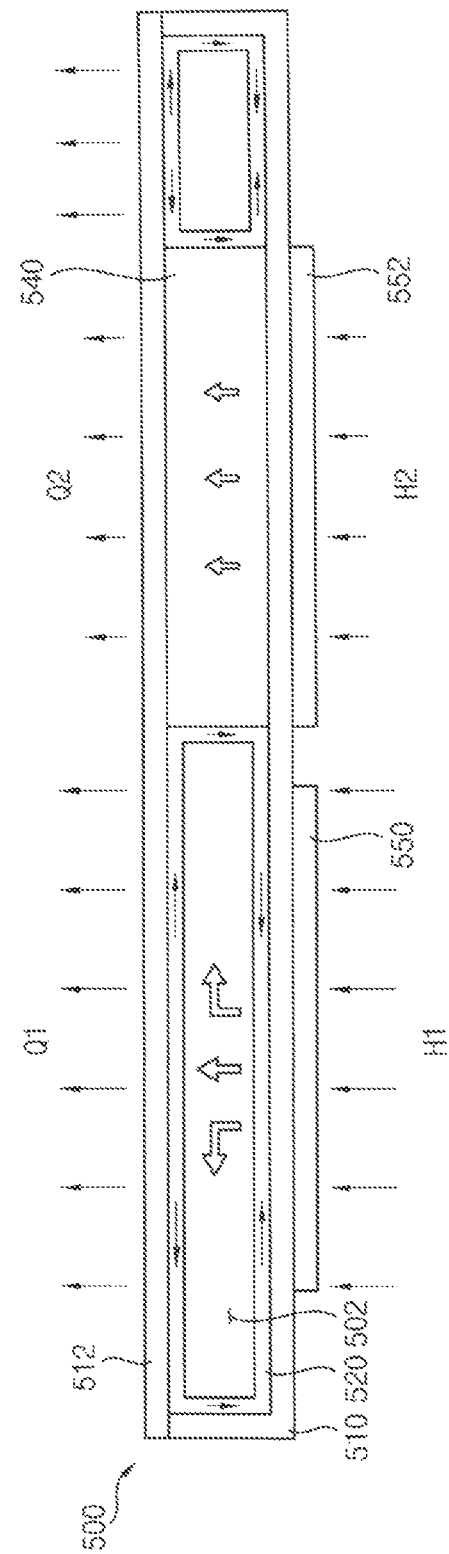

FIG. 1 is a cross-sectional view illustrating an electronic device in accordance with example embodiments. FIG. 2 is an exploded perspective view illustrating the electronic device in FIG. 1. FIG. 3 is a cross-sectional view illustrating a heat dissipating assembly of the electronic device in FIG. 1. FIG. 4 is a plan view illustrating the heat dissipating assembly in FIG. 3. FIGS. 5 and 6 are exploded perspective views illustrating a portion of the heat dissipating assembly in accordance with example embodiments. FIG. 7 is a cross-sectional view illustrating heat transfer in the heat dissipating assembly in FIG. 3.

Referring to FIGS. 1 to 7, an electronic device 10 may include a substrate 100, first and second electronic products 200 and 300 mounted on the substrate 100, and a heat dissipating assembly 500 disposed on the first and second electronic products 200 and 300 and being in thermal communication with the first and second electronic products 200 and 300. For example, the first and second electronic products 200 and 300 may be semiconductor chips including circuits formed in the semiconductor chips.

In example embodiments, the electronic device 10 may be a memory module having a stacked chip structure of a plurality of stacked dies (chips), e.g., stacked memory dies/chips. For example, the electronic device 10 may include a semiconductor memory device of 2.5D chip structure. The electronic device 10 including the 2.5D chip structure may include an interposer 400 (e.g., interposer substrate) configured to electrically connect the first and second electronic products 200 and 300. For example the electronic device 10 may be a 2.5D integrated circuit (IC) package including an interposer substrate 400. For example, the electronic device 10 may include a plurality of semiconductor chips arranged on the interposer substrate 400. The semiconductor chips may be electrically connected to each other through a conductor line formed on/in the interposer substrate 400. For example, the electronic device 10 may include semiconductor chips stacked together as shown in FIG. 1. In certain embodiments, the electronic device 10 may have non-stack structure (e.g., single layer of chips) in which a plurality of semiconductor chips are laterally arranged on an interposer substrate 400. In certain embodiments, the electronic device 10 may have a 3D IC package structure.

In this case, the first electronic product 200 may include a logic semiconductor device, and the second electronic product 300 may include a memory device. The logic semiconductor device may be ASIC as a host, for example, CPU, GPU, SoC, etc. The memory device may include HBM (High Bandwidth Memory) device.

As illustrated in FIGS. 1 and 2, the semiconductor memory device may be mounted on the substrate 100. The semiconductor memory device may include ASIC 200 as the first electronic product and HBM 300 as the second electronic product. The ASIC 200 and the HBM 300 may be arranged on the interposer 400 to be spaced apart from each other in a first direction. The HBM 300 may include a buffer die 310 functioning as circuitry and a plurality of memory dies (chips) 320 (here 320a, 320b, 320c, 320d) sequentially stacked on the buffer die 310. For example, the buffer die 310 may include electronic circuit (e.g., conductor lines and/or electronic components) formed on/in the buffer die 310.

The ASIC 200 may be mounted on the interposer 400 via solder bumps 240, and the buffer die 310 may be mounted on the interposer 400 via solder bumps 340. The buffer die 310 and the memory dies 320a, 320b, 320c, 320d may be electrically connected to each other by TSVs (through silicon vias) 330. The TSVs 330 may be electrically connected to each other by solder bumps 322. The buffer die 310 and the memory dies 320a, 320b, 320c, 320d may communicate data signals and control signals with each other through the TSVs 330.

The interposer 400 may include connection wirings 410 formed therein. The ASIC 200 and the HBM 300 may be electrically connected to each other by the connection wirings 410 in the interposer 400 or electrically connected to the substrate 100 by the solder bumps 420.

In example embodiments, the first electronic product 200 may be a first heat source consuming a first power, and the second electronic product 300 may be a second heat source consuming a second power lower than the first power. For example, the first power may range from about 50W to about 300W, and the second power may range from about 5W to about 70W. For example, the maximum power consumption of the first electronic product 200 may be higher than the maximum power consumption of the second electronic product 300. For example, an overall power consumption of the first product 200 for a relatively long time (e.g., for ten minutes or more during a normal operation) may be higher than the overall power consumption of the second electronic product 300. Accordingly, the first electronic product 200 may generate a greater amount of heat than the second electronic product 300.

The first electronic product 200 may have a first height from an upper surface of the interposer 400, and the second electronic product 300 may have a second height from the upper surface of the interposer 400. For example, the first height and the second height may be substantially identical to each other.

In example embodiments, the heat dissipating assembly 500 may cover the first and second electronic products 200 and 300 and may be in thermal communication with the first and second electronic products 200 and 300 to dissipate heat coming from the first and second electronic products 200 and 300 to the environment, e.g., outside.

As illustrated in FIGS. 1 and 3, the heat dissipating assembly 500 may include a heat dissipating chamber 502 in thermal contact with the first electronic product 200. The heat dissipating assembly 500 may include a thermal conductive member 540 provided in the heat dissipating chamber 502 and the thermal conductive member 540 may be in thermal contact with the second electronic product 300. The heat dissipating assembly 500 may include a first thermal interface material 550 and a second thermal interface material 552 disposed on a lower surface of the heat dissipating chamber 502.

The heat dissipating chamber 502 may extend laterally and outwardly from a first region in thermal contact with the first electronic product 200. The first region of the heat dissipating chamber 502 may be a region overlapped with the first electronic product 200 in a plan view. The thermal conductive member 540 may be arranged to be overlapped with the second electronic product 300. The thermal conductive member 540 may extend vertically from a second region in thermal contact with the second electronic product 300. The second region of the thermal conductive member 540 may be a region overlapped with the second electronic product 300.

The heat dissipating assembly 500 may be supported on the substrate 100 by an assembly support 120. The assembly support 120 may have a ring shape extending along a peripheral region of the substrate 100. The assembly support 120 may surround the first and second electronic products 200 and 300. The heat dissipating assembly 500 may be adhered onto the assembly support 120.

As illustrated in FIG. 4, in a plan view, the heat dissipating assembly 500 may have a rectangular or square shape corresponding to the substrate 100. The heat dissipating chamber 502 may extend laterally across outer sidewalls of the first electronic product 200 in the plan view. The heat dissipating chamber 502 may have an area corresponding to the substrate 100 in the plan view. The heat dissipating chamber 502 may surround the thermal conductive member 540, e.g., in the plan view or three dimensionally.

The heat dissipating chamber 502 may include a lower wall 510 and an upper wall 512 hermetically connected to the lower wall 510 to define a space for receiving a heat transfer fluid therein. For example, the heat transfer fluid may be a liquid, a gas or a phase change material. For example, the heat transfer fluid may be a liquid at a room temperature and may be turned into vapor status when the temperature goes up to a certain temperature. Outer peripheral portions of the lower wall 510 and the upper wall 512 may be adhered together to form an airtightly sealed space. The hermetically sealed space of the chamber may vertically extend from the upper surface of bottom of the lower wall 510 to the lower surface of the upper wall 512. The hermetically sealed space of the chamber may horizontally extend between the sidewalls of the chamber (in this example, formed by the vertically extending portions of the lower wall 510). A wick structure 520 may be positioned within the hermetically sealed space of the chamber at least at locations over the first electronic product 200 (e.g., fully or partially overlap the first electronic product 200 with respect to a plan or top down view, such as shown in FIG. 4) and extend between and contact the upper surface of the bottom of the lower wall 510 and the lower surface of the upper wall 512. The wick structure 520 may include space to allow the flow of heat transfer fluid at locations occupied by the wick structure 520 with respect to a plan view. The thermal conductive member 540 may be positioned within the hermetically sealed space of the chamber at least at a location over HBM 300 (e.g., overlap HBM 320 with respect to a plan or top down view, such as shown in FIG. 4) and may extend between and contact the upper surface of the bottom of the lower wall 510 and the lower surface of upper wall 512. The thermal conductive member 540 may be solid, such as solid metal, and may occupy the space of the chamber 502 in the vertical direction to interrupt and prevent the flow of heat transfer fluid within the chamber at the location of thermal conductive member 540 (e.g., with respect to the plan view). The area occupied by thermal conductive member 540 (with respect to the plan view) may be chosen based upon design considerations and may be a function of the area (with respect to the plan view) of the uppermost memory chip 320d e.g., as shown in FIG. 1. For example, the area occupied by thermal conductive member 540 may be substantially the same as that of the uppermost chip 320d, such as having a border aligned with a border of the uppermost chip 320d (with respect to the plan view). However, the area occupied by thermal conductive member 540 may be larger or smaller than that of uppermost memory chip 320d, such as between 50% and 150% or between 80% and 120%.

The lower wall 510 and the upper wall 512 may include a plate material having strength capable of sufficiently protecting inner structures. The lower wall 510 and the upper wall 512 may include a metal such as aluminum, titanium, etc., plastic, metalized plastic, graphite, plastic combinations, etc. For example, the lower wall 510 and the upper wall 512 may be formed using a copper plate.

In example embodiments, the lower wall 510 may be arranged close to be in thermal contact with the first and second electronic products 200 and 300. In order to increase a contact surface with the first and second electronic products 200 and 300, a surface treatment may be performed on the lower wall 510. A portion of the lower wall 510 in thermal contact with the first and second electronic products 200 and 300 may have a structure capable of maximize a supply of the heat transfer fluid.

A first thermal interface material (TIM) 550 may be interposed between the first electronic product 200 and the first region of the heat dissipating chamber 502, and a second thermal interface material (TIM) 552 may be interposed between the second electronic product 300 and the second region of the thermal conductive member 540. Accordingly, the heat dissipating chamber 502 may be thermally connected to the first electronic product 200 through the first thermal interface material 550, and the thermal conductive member 540 may be thermally connected to the second electronic product 300 through the second thermal interface material 552.

In example embodiments, the heat dissipating chamber 502 may further include a wick structure 520 which is provided in an inner surface of the heat dissipating chamber 502 to thermally interconnect the lower wall 510 and the upper wall 512. Additionally, the heat dissipating chamber 502 may further include a support structure supporting the wick structure 520 between the lower wall 510 and the upper wall 512.

As illustrated in FIG. 5, the support structure may include a plurality of thermal conductive pillars 530 which are arranged in the heat dissipating chamber 502 to be spaced apart from each other. The thermal conductive pillars 530 may extend from the wick structure 520 on the lower wall 510 to the wick structure 520 on the upper wall 512. For example, the thermal conductive pillars 530 may extend from a bottom of the wick structure 520 to a top of the wick structure 520. As illustrated in FIG. 6, the support structure may include a plurality of spacers 531 which are arranged in the heat dissipating chamber 502 to be spaced apart from each other.

In example embodiments, the thermal conductive member 540 may extend vertically from the second region in contact with the second electronic product 300 within the heat dissipating chamber 502. The thermal conductive member 540 may include at least one thermal conductive pillar which extends from the lower wall 510 to the upper wall 512 of the heat dissipating chamber 502. For example, one or more thermal conductive pillars may be arranged to be overlapped with the second electronic product 300. The thermal conductive member 540 may include a metal such as copper (Cu).

The heat dissipating chamber 502 may have a first thermal conductivity, and the thermal conductive member 540 may have a second thermal conductivity less than the first thermal conductivity. For example, the heat dissipating chamber 502 may have the first thermal conductivity of about 20,000 W/mK or more, and the thermal conductivity member 540 may have the second thermal conductivity of about 385 W/mk.

A vaporized gas of the heat transfer fluid within the heat dissipating chamber 502 may transfer heat from the lower wall 510 to the upper wall 512 and then a condensed liquid may move to the lower wall 510 along the wick structure 520. Accordingly, the heat transfer fluid may move quickly along the extending direction to dissipate heat coming from the first electronic product 200 to the environment, e.g., outside. On the other hand, the thermal conductive member 540 may transfer heat from the second electronic product 300 along the vertical direction (extending direction) and dissipate the heat to the environment, e.g. outside the thermal conductive member 540. For example, a thermal conductivity in the vertical direction of the thermal conductive member 540 may be much greater than a thermal conductivity in a horizontal direction of the thermal conductive member 540.

The thermal conductive member 540 may be arranged within the heat dissipating chamber 502 to be overlapped with the second electronic product 300. A vaporized gas within the heat dissipating chamber 502 may be blocked from moving to the region overlapped with the second electronic product 300 by the thermal conductive member 540. Accordingly, heat from the first electronic product 200 may be prevented (or reduced) from being transferred to the second electronic product 300.

As illustrated in FIG. 7, when the first and second electronic products 200 and 300 generate heat H1 and H2, the heat may be transferred to the heat dissipating chamber 502 and the thermal conductive member 540 of the heat dissipating assembly 500 through the first and second thermal interface materials 550 and 552 respectively. In here, a liquid of the heat transfer fluid may be absorbed in the capillary wick structure 520 on the inner surface of the lower wall 510. For example, the heat dissipating chamber 502 may be configured to condense evaporated fluid on and/or near the inner surface of the upper wall 512 of the heat dissipating chamber 502 to turn the evaporated fluid into a liquid fluid, and the capillary wick structure 520 may be configured to absorb the condensed liquid fluid and to send the condensed liquid fluid near or to the inner surface of the lower wall 510 of the heat dissipating chamber 502 through a capillary structure. The liquid fluid may be evaporated when the liquid fluid absorbs heat from the inner surface of the lower wall 510. While FIGS. 1, 3, 4 and 7 illustrates that the thermal conductive member 540 is disposed in the heat dissipating chamber 502, in certain embodiments, the thermal conductive member 540 may be formed with a separated structure from the heat dissipating chamber 502. In these embodiments, the thermal conductive member 540 may contact with the heat dissipating chamber 502 in its four sides in a plan view which may have the same plan view as or a similar plan view to FIG. 4. In certain embodiments, there may be a gap between one or more sides of the thermal conductive member 540 and the heat dissipating chamber 502 of which plan view may be shown differently from FIG. 4. In these embodiments, the heat dissipating chamber 502 may have a ring shape.

Then, the heat H1 from the first electronic product 200 may be transferred to the liquid in the capillary wick structure 520 and the heat transfer fluid may evaporate into vapor. Here, the heat transfer fluid may absorb the heat H1 transferred from the first electronic product 200, and some of the vapor may move horizontally and other of the vapor may move to the upper wall 512, for example, the vapor may spread quickly along the extending direction of the heat dissipating chamber 502 to release heat Q1 through the upper wall 512 to the environment.

On the other hand, the heat H2 from the second electronic product 300 may be transferred from the lower wall 510 to the upper wall 512 through the thermal conductive member 540 in the vertical direction, to release heat Q2 through the upper wall 512 to the environment. Here, the heat from the heat dissipating chamber 502 may be blocked from being transferred to the region overlapped with the second electronic product 300 by the thermal conductive member 540, to thereby prevent (or reduce) the heat generated from the first electronic product 200 from being transferred to the second electronic product 300. For example, the heat coming from the wick structure and/or from the first electronic product 200 may be disturbed by the thermal conductive member 540 to be transferred to the thermal conductive member 540 and/or to the second electronic product 300.

As mentioned above, the heat dissipating chamber 502 may be disposed over the first electronic product 200 consuming a relatively high power and the second electronic product 300 consuming a relatively low power to dissipate heat generated from the first electronic product 200 quickly, and the thermal conductive member 540 may be arranged within the heat dissipating chamber 502 to be overlapped with the second electronic product 300 to dissipate heat generated from the second electronic product 300 in the vertical direction and to prevent (or limit) the heat generated from the first electronic product 200 from being transferred to the second electronic product 300.

Accordingly, the electronic device including the electronic products consuming different powers such as 2.5D package may be efficiently thermally dissipated, to thereby improve heat transfer efficiency of the electronic device.

Hereinafter, a method of manufacturing the electronic device in FIG. 1 will be explained.

FIGS. 8 to 11 are views illustrating a method of manufacturing an electronic device in accordance with example embodiments.

Figure 8:
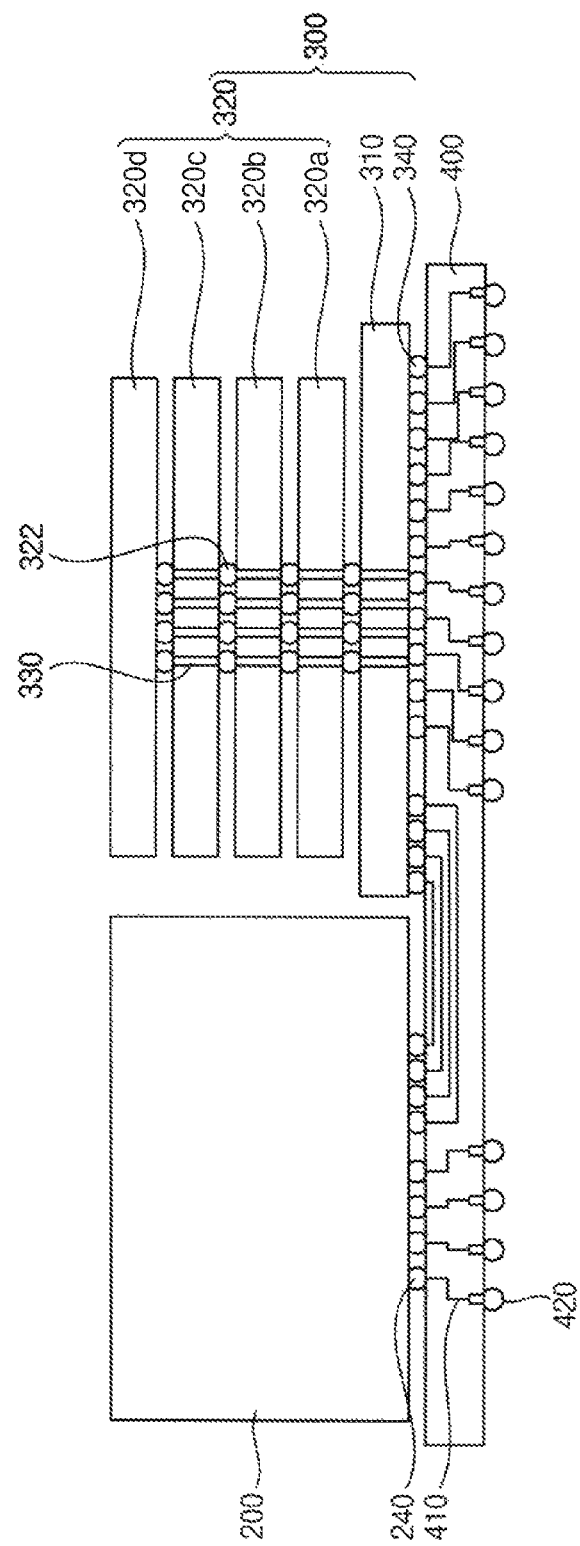

Referring to FIG. 8, first, a semiconductor memory device including a first electronic product 200 and a second electronic product 300 may be formed.

In example embodiments, each of the first electronic product 200 and the second electronic product 300 may be mounted on an interposer 400, e.g., an interposer substrate. For example, the semiconductor memory device may have a 2.5D chip structure. For example, the semiconductor memory device may include a plurality of semiconductor chips arranged on the interposer 400. The semiconductor chips may be stacked together or may be arranged in single layer of chips. In this case, the first electronic product 200 may include a logic semiconductor device, and the second electronic product 300 may include a memory device. The logic semiconductor device may be ASIC as a host, for example, CPU, GPU, SoC, etc. The memory device may include HBM (High Bandwidth Memory) device.

The second electronic product 300 may include a buffer die 310 and a plurality of memory dies (chips) 320a, 320b, 320c, 320d sequentially stacked on the buffer die 310. The buffer die 310 and the memory dies 320a, 320b, 320c, 320d may be electrically connected to each other by TSVs (through silicon vias) 330. The TSVs 330 may be electrically connected to each other by solder bumps 322. The buffer die 310 and the memory dies 320a, 320b, 320c, 320d may communicate data signals and control signals with each other through the TSVs 330.

The first electronic product 200 may be mounted on the interposer 400 via solder bumps 240, and the buffer die 310 of the second electronic product 300 may be mounted on the interposer 400 via solder bumps 340.

The interposer 400 may include connection wirings 410 formed therein. The first electronic product 200 and the second electronic product 300 may be electrically connected to each other by the connection wirings 410 in the interposer 400 or electrically connected to the substrate 100 by the solder bumps 420.

In example embodiments, the first electronic product 200 may be a first heat source consuming a first power, and the second electronic product 300 may be a second heat source consuming a second power lower than the first power. For example, the first power may range from about 50W to about 300W, and the second power may range from about 5W to about 70W. Accordingly, the first electronic product 200 may generate greater amount of heat than the second electronic product 300.

Figure 9:
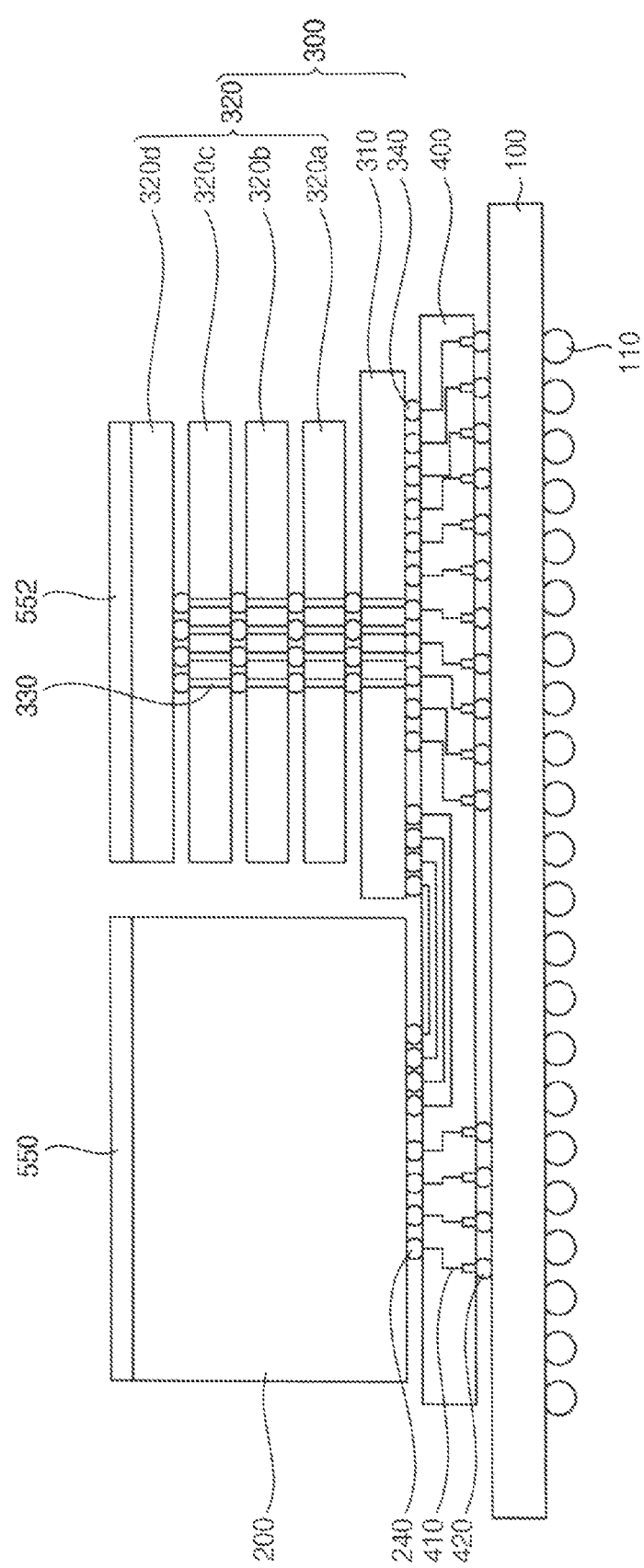

Referring to FIG. 9, the semiconductor memory device may be mounted on a substrate 100.

The interposer 400 may be mounted on the substrate 100 through the solder bumps 420. For example, the substrate 100 may include a printed circuit board (PCB), a glass substrate, a ceramic substrate, a module board, etc. The interposer 400 may be mounted on the substrate 100 by a flip chip bonding process.

Figure 10:
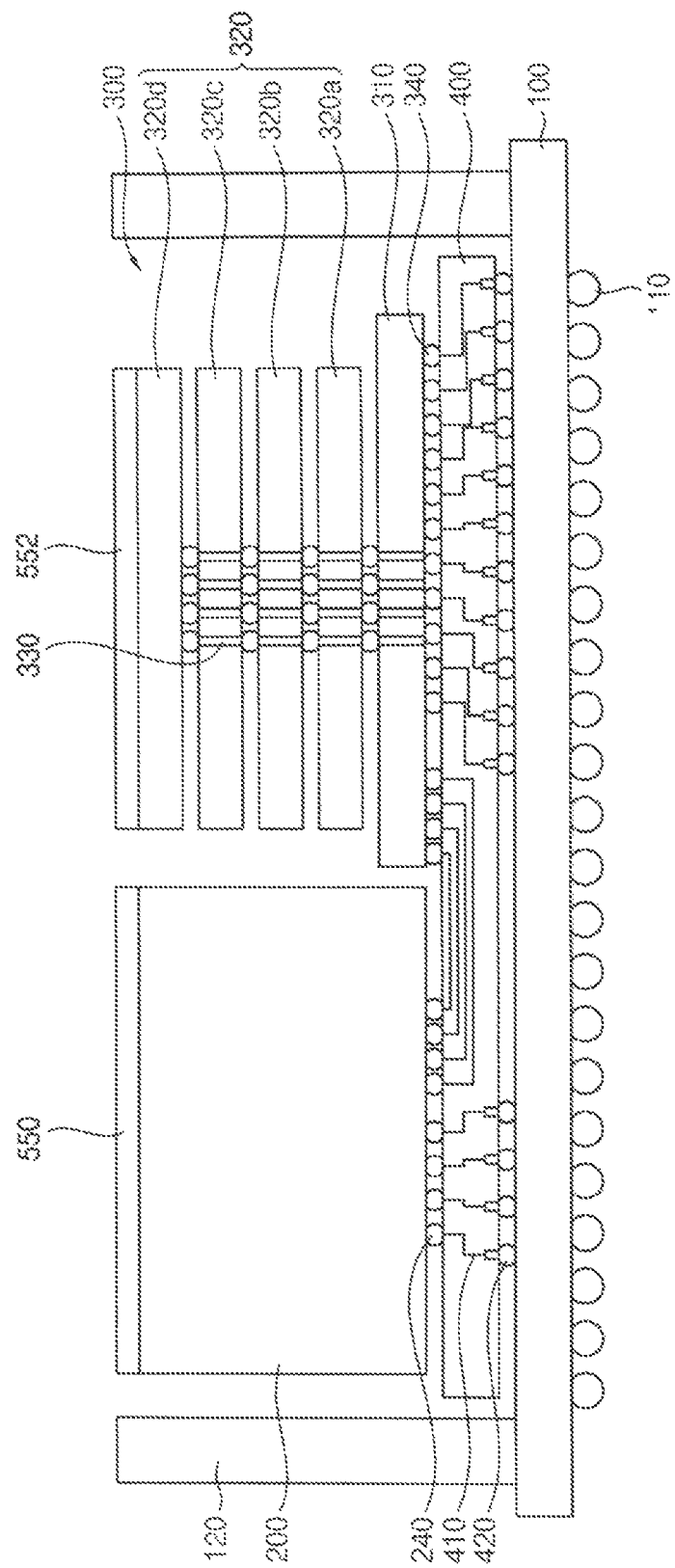
Figure 11:
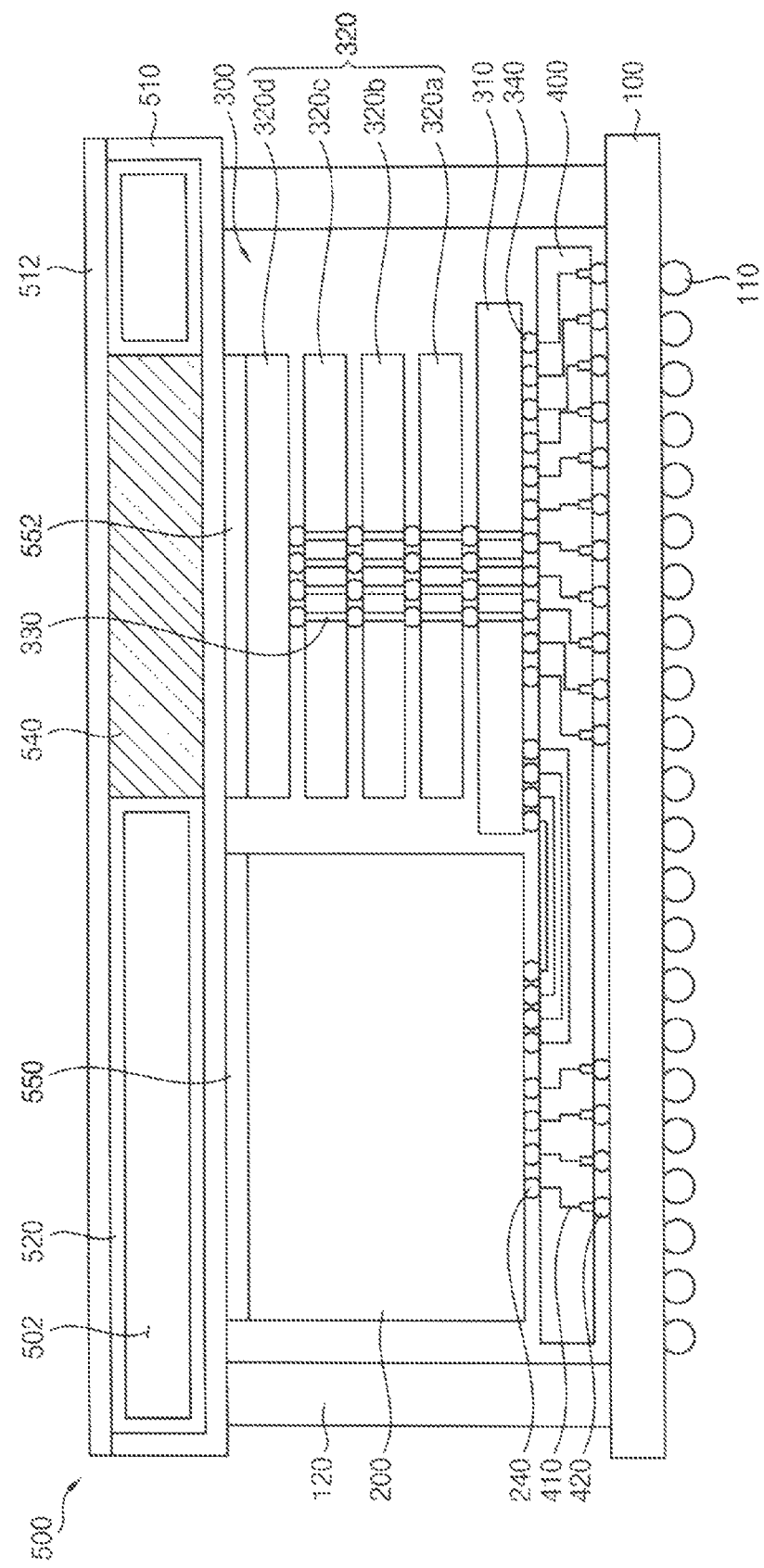

Referring to FIGS. 10 and 11, a heat dissipating assembly 500 may be formed to cover the first and second electronic products 200 and 300.

First, an assembly support 120 may be formed on an upper surface of the substrate 100. The assembly support 120 may be formed to have a ring shape extending along a peripheral region of the substrate 100, e.g., in a plan view. The assembly support 120 may be formed to surround the first and second electronic products 200 and 300.

Then, a first thermal interface material 550 may be coated on an upper surface of the first electronic product 200, and a second thermal interface material 552 may be coated on an upper surface of the second electronic product 300. The first and second thermal interface materials 550 and 552 may include a polymer material. Examples of the polymer material may be a thermal conductive adhesive tape, a thermal conductive grease, a thermal conductive interface pad, a thermal conductive adhesive, etc.

Then, a heat dissipating assembly 500 may be adhered onto the assembly support 120 to be in thermal communication with the first and second electronic products 200 and 300.

A heat dissipating chamber 502 of the heat dissipating assembly 500 may be in thermal contact with the first electronic product 200. A thermal conductive member 540 of the heat dissipating assembly 500 may be provided in the heat dissipating chamber 502 and the thermal conductive member 540 may be in thermal contact with the second electronic product 300.

The heat dissipating chamber 502 may extend laterally and outwardly from a first region in thermal contact with the first electronic product 200. The first region of the heat dissipating chamber 502 may be a region overlapped with the first electronic product 200 e.g., in a plan view. The thermal conductive member 540 may be arranged to be overlapped with the second electronic product 300 e.g., in a plan view. The thermal conductive member 540 may extend vertically from a second region in thermal contact with the second electronic product 300. The second region of the thermal conductive member 540 may be a region overlapped with the second electronic product 300 in the plan view.

The heat dissipating chamber 502 may extend laterally across outer sidewalls of the first electronic product 200, e.g., in a plan view. The heat dissipating chamber 502 may have an area corresponding to the substrate 100. For example, the heat dissipating chamber 502 may have substantially the same area as the substrate 100 in a plan view. The thermal conductive member 540 may be placed within the heat dissipating chamber 502 to provide a space that surrounds the thermal conductive member 540 with respect to the plan view, thus allowing the flow of heat transfer fluid on all sides (with respect to the plan view) of the thermal conductive member 540.

The first thermal interface material 550 may be interposed between the first electronic product 200 and the first region of the heat dissipating chamber 502, and the second thermal interface material 552 may be interposed between the second electronic product 300 and the second region of the thermal conductive member 540. Accordingly, the heat dissipating chamber 502 may be thermally connected to the first electronic product 200 through the first thermal interface material 550, and the thermal conductive member 540 may be thermally connected to the second electronic product 300 through the second thermal interface material 552.

Figure 12:
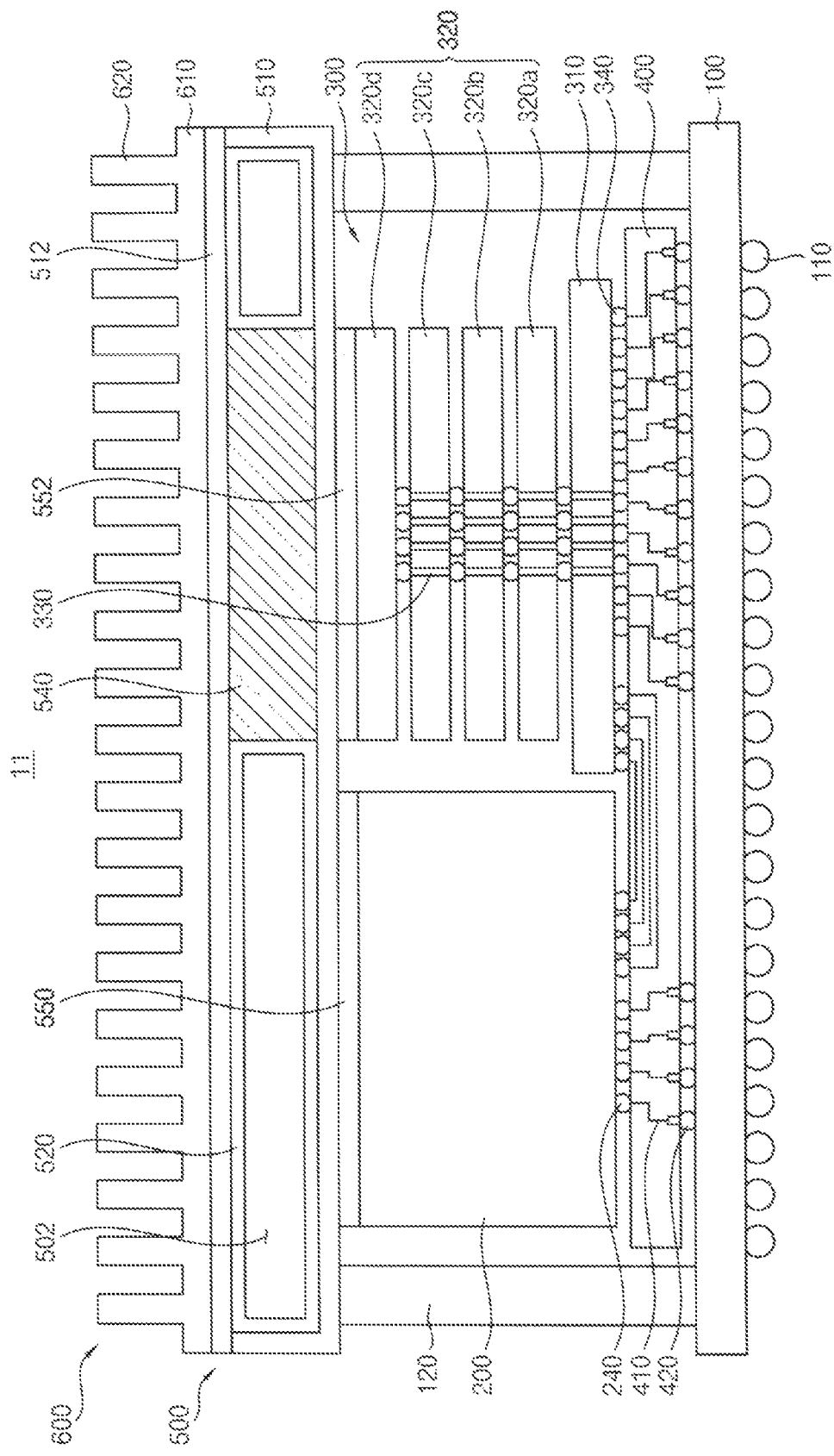

FIG. 12 is a cross-sectional view illustrating an electronic device in accordance with example embodiments. The electronic device may be substantially the same as or similar to the electronic device described with reference to FIG. 1 except for an additional heat sink. Thus, same reference numerals will be used to refer to the same or like elements and any further repetitive explanation concerning the above elements will be omitted.

Referring to FIG. 12, an electronic device 11 may include a substrate 100, first and second electronic products 200 and 300 mounted on the substrate 100, a heat dissipating assembly 500 disposed on the first and second electronic products 200 and 300 and being in thermal communication with the first and second electronic products 200 and 300, and a heat sink 600 disposed on an upper surface of the heat dissipating assembly 500.

In example embodiments, the heat sink 600 may cover the upper surface of the heat dissipating assembly 500 and be thermally connected to the heat dissipating assembly 500. The heat sink 600 may be mounted detachably on the upper surface of the heat dissipating assembly 500.

The heat sink 600 may include a thermal conductive base plate 610 covering the upper surface of an upper wall 512 of the heat dissipating chamber 502 and a plurality of radiation fins 620 protruding upwardly from the base plate 610.

The base plate 610 may have a rectangular or square shape corresponding to the heat dissipating assembly 500. The base plate 610 may cover most of the upper surface of the heat dissipating assembly 500. For example, the base plate 610 may have substantially the same area as the area of the heat dissipating assembly 500 in a plan view. The base plate 610 may include a metal having a high thermal conductivity. For example, the base plate 610 may include aluminum or aluminum alloy.

A lower surface of the base plate 610 may be in thermal contact with the upper surface of the heat dissipating assembly 500. For example, the base plate 610 may be in thermal communication with the heat dissipating assembly 500 to dissipate heat generated from the first and second electronic products to the environment.

The radiation fins 620 may protrude from the upper surface of the base plate 610. The radiation fin 620 protruding from the base plate 610 may provide a greater thermal contact surface with the environment, thereby dissipating heat from the electronic device 11 to the environment. The radiation fin 620 may have a geometric or structural configuration for heat radiation. For example, the radiation fin 620 may have a comb shape in a cross-sectional view as shown in FIG. 12.

Figure 13:
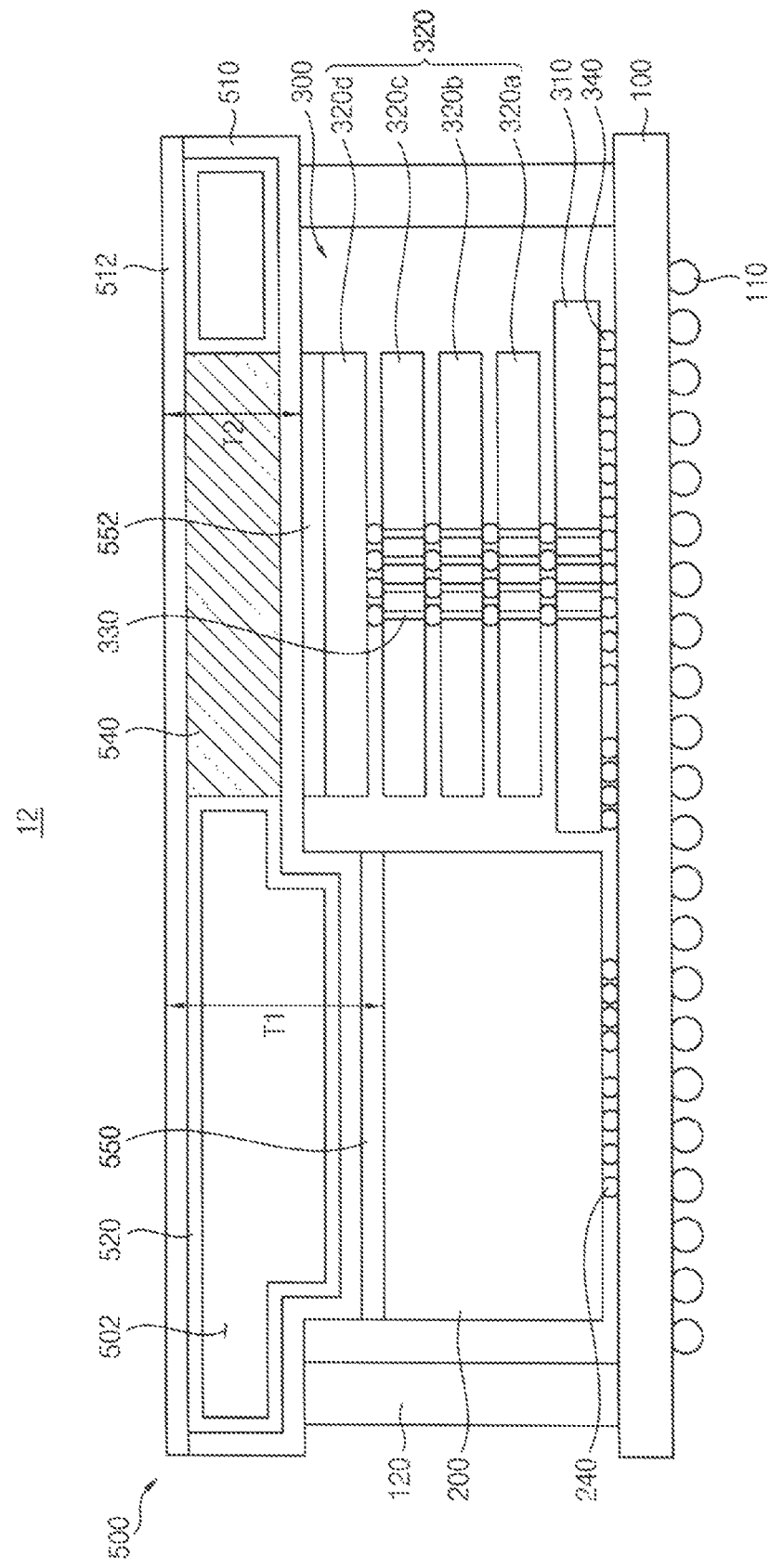

FIG. 13 is a cross-sectional view illustrating an electronic device in accordance with example embodiments. The electronic device may be substantially the same as or similar to the electronic device described with reference to FIG. 1 except for a configuration of a package and a shape of a heat dissipating assembly. Thus, same reference numerals will be used to refer to the same or like elements and any further repetitive explanation concerning the above elements will be omitted.

Referring to FIG. 13, an electronic device 12 may include a substrate 100, first and second electronic products 200 and 300 mounted on the substrate 100, and a heat dissipating assembly 500 disposed on the first and second electronic products 200 and 300 and being in thermal communication with the first and second electronic products 200 and 300.

In example embodiments, the electronic device 12 may be a memory module having a stacked chip structure of a plurality of dies (chips) stacked therein. For example, the electronic device 12 may include a semiconductor memory device of a 3D chip structure.

In certain embodiments, the first and second electronic products 200 and 300 may be mounted directly on the substrate 100 without an addition element such as an interposer. The first electronic product 200 may be mounted on the substrate 100 through solder bumps 240, and the second electronic product 300 may be mounted on the substrate 100 through solder bumps 340. For example, the first electronic product 200 may include a logic semiconductor device, and the second electronic product 300 may include a memory device. However, the invention is not limited thereto.

In example embodiments, the first electronic product 200 may have a first height from an upper surface of the substrate 100, and the second electronic product 300 may have a second height greater than the first height from the upper surface of the substrate 100.

The heat dissipating assembly 500 may have an even/flat upper surface. Accordingly, a first portion of the heat dissipating assembly 500 overlapped with the first electronic device 200 may have a first thickness, and a second portion of the heat dissipating assembly 500 may have a second thickness less than the first thickness.

An electronic device in accordance with example embodiments may be applied for a semiconductor package including a logic device or a memory device and a semiconductor module including the semiconductor package. For example, the semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like. The electronic device may be embodied by a personal computer PC or a portable electronic device such as a notebook, a cell phone, a personal digital assistant (PDA) and a camera.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. An electronic device, comprising:
a substrate;
a first electronic product arranged on the substrate;
a second electronic product arranged on the substrate spaced apart from the first electronic product; and
a heat dissipating assembly covering the first and second electronic products, the heat dissipating assembly comprising a heat dissipating chamber including a hermetically sealed space having a first portion having one or more gaps in which a flowable heat dissipation fluid is disposed and having a second portion in which a solid thermal conductive member is disposed to prevent the flow of the heat dissipation fluid across the second portion with respect to a plan view,
wherein the first portion of the heat dissipating chamber has a first thermal conductivity and overlaps with the first electronic product in the plan view,
wherein the solid thermal conductive member has a second thermal conductivity less than the first thermal conductivity,
wherein the solid thermal conductive member overlaps with the second electronic product in the plan view,
wherein the overlapping area of the solid thermal conductive member with the second electronic product is greater than 50% of an area of the second electronic product in the plan view.

2. The electronic device of claim 1, wherein the heat dissipating chamber extends laterally from a first region overlapping with the first electronic product in the plan view.

3. The electronic device of claim 1, wherein the heat dissipating chamber surrounds the solid thermal conductive member with respect to the plan view.

4. The electronic device of claim 1, wherein the overlapping area of the solid thermal conductive member with the second electronic product is substantially the same as the area of the second electronic product in the plan view.

5. The electronic device of claim 1, wherein the solid thermal conductive member extends vertically from a second region overlapping with the second electronic product.

6. The electronic device of claim 1, wherein the solid thermal conductive member comprises at least one thermal conductive pillar which extends from a lower wall of the heat dissipating chamber to an upper wall of the heat dissipating chamber.

7. The electronic device of claim 1, wherein the maximum power consumption of the first electronic product is greater than the maximum power consumption of the second electronic product.

8. The electronic device of claim 1, wherein the heat dissipating chamber comprises an upper plate and a lower plate attached to the upper plate to provide the hermetically sealed space extending between the upper plate and the lower plate, and wherein the solid thermal conductive member extends between and contacts the upper plate and the lower plate.

9. The electronic device of claim 8, wherein the heat dissipating chamber comprises a wick structure which is provided within the heat dissipating chamber to thermally interconnect a lower wall and an upper wall.

10. The electronic device of claim 9, wherein the heat dissipating chamber further comprises a support structure supporting the wick structure between the lower wall and the upper wall.

11. The electronic device of claim 10, wherein the support structure comprises a plurality of thermal conductive pillars arranged in the heat dissipating chamber and spaced apart from each other.

12. The electronic device of claim 10, wherein the support structure comprises a plurality of spacers arranged in the heat dissipating chamber and spaced apart from each other.

13. The electronic device of claim 1, wherein the first electronic product comprises a logic semiconductor device and the second electronic product comprises a memory device.

14. The electronic device of claim 13, wherein the memory device comprises a stack of memory dies and a buffer die on which the stack of memory dies is positioned.

15. The electronic device of claim 13, further comprising an interposer electrically connecting the logic semiconductor device and the memory device.

16. The electronic device of claim 1, further comprising a first thermal interface material and a second thermal interface material, the first thermal interface material disposed on a first region of the heat dissipating chamber, the first region overlapping with the first electronic product in the plan view, the second thermal interface material disposed on a second region of the heat dissipating chamber overlapping with the solid thermal conductive member in the plan view, the second region overlapping with the second electronic product in the plan view.

17. The electronic device of claim 1, wherein top surfaces of the first electronic product and the second electronic product are positioned at different heights.

18. The electronic device of claim 1, further comprising a heat sink on an upper surface of the heat dissipating assembly.

19. An electronic device, comprising:
a substrate;
a first electronic product arranged on the substrate and consuming a first maximum power;
a second electronic product arranged on the substrate to be spaced apart from the first electronic product and consuming a second maximum power less than the first maximum power; and
a heat dissipating assembly on the first and second electronic products to be in thermal communication with the first and second electronic products, the heat dissipating assembly comprising a lower wall and an upper wall hermetically connected to each other to define a heat dissipating chamber for receiving a heat transfer fluid therein, and a thermal conductive member provided in the heat dissipating chamber and in thermal contact with the second electronic product,
wherein the thermal conductive member comprises a solid metal and overlaps with the second electronic product in a plan view,
wherein the overlapping area of the thermal conductive member with the second electronic product is greater than 50% of an area of the second electronic product in the plan view.

* * * * *